(12) United States Patent
Best et al.

(10) Patent No.: US 6,657,468 B1
(45) Date of Patent: Dec. 2, 2003

(54) APPARATUS AND METHOD FOR CONTROLLING EDGE RATES OF DIGITAL SIGNALS

(75) Inventors: Scott C. Best, Palo Alto, CA (US); Donald V. Perino, Los Altos, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/467,446

(22) Filed: Dec. 20, 1999

(51) Int. Cl.[7] .................................................. H03K 5/12

(52) U.S. Cl. ....................................... 327/170; 327/172

(58) Field of Search ............................... 327/170, 134, 327/407, 108, 172; 326/27, 30, 83

(56) References Cited

U.S. PATENT DOCUMENTS

| | | | | |
|---|---|---|---|---|
| 5,283,631 A | * | 2/1994 | Koerner et al. | 327/170 |
| 5,389,828 A | * | 2/1995 | Tago | 327/263 |

OTHER PUBLICATIONS

Glasser et al., "The Design and Analysis of VLSI Circuits", Addison–Wesley Publishing Company, Copyright© 1985.

* cited by examiner

Primary Examiner—Dinh T. Le
(74) Attorney, Agent, or Firm—Pennie & Edmonds LLP (57) ABSTRACT

A circuit to control the edge rate of a digital signal includes a conductor to carry a digital signal. A first capacitive component has a first node and a second node, with the second node being coupled to the conductor. A first phase control circuit has a first input node coupled to the conductor, a second input node to receive a first enable signal and an output node coupled to the first node of the first capacitive component. The first phase control circuit processes the digital signal from the conductor and the first enable signal to produce a control signal at the output node to control the edge rate of the digital signal. The first phase control circuit produces the control signal in one of at least two different phase relationships with the digital signal according to a state of the first enable signal. The control signal may be in phase with the digital signal or complementary to the digital signal.

21 Claims, 10 Drawing Sheets

APPARATUS AND METHOD FOR CONTROLLING EDGE RATES OF DIGITAL SIGNALS

BRIEF DESCRIPTION OF THE INVENTION

This invention relates generally to digital signaling. More particularly, this invention relates to circuits for controlling edge rates of digital signals.

BACKGROUND OF THE INVENTION

Edge-rate control circuits are circuits for controlling the rate at which signals transition between digital levels. Such circuits are useful, for example, for providing adjustable delays, slew rates and duty cycles. Prior art edge-rate control circuits typically operate in either a fast mode or a slow mode according to the state of a control input. In a fast mode, the edge rate of the signal being controlled is relatively fast, speeding transition of the signal from one digital level to another. In a slow mode, the edge rate is relatively slow, delaying transition of the signal between digital levels.

Figure 1A:
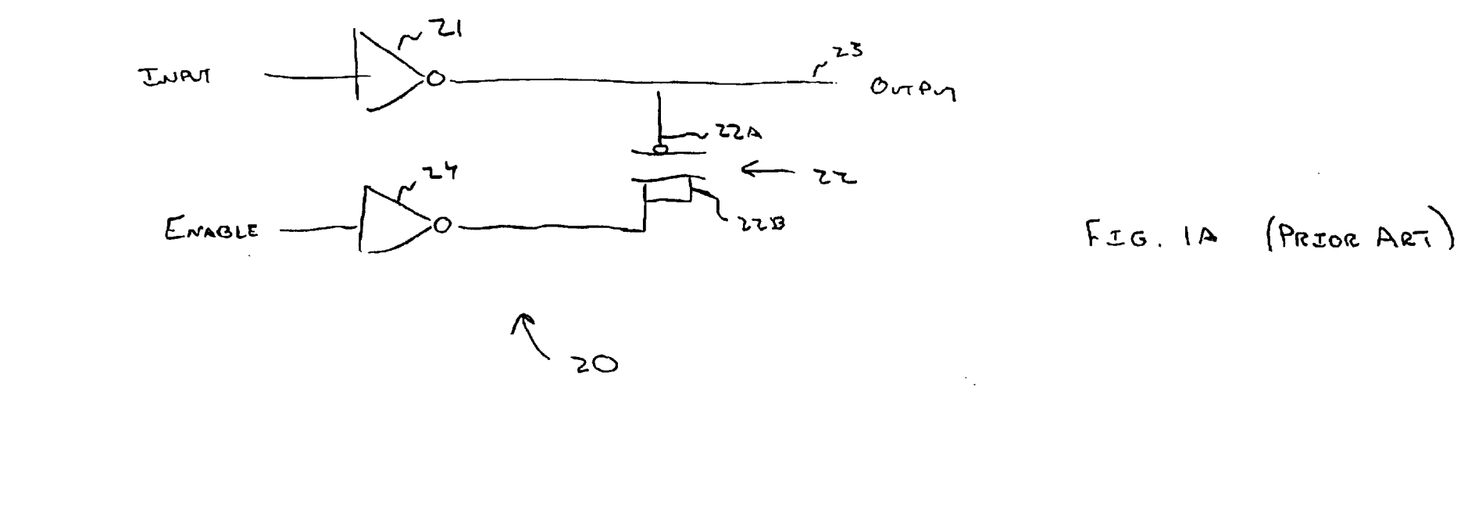
FIG. 1A illustrates a prior art edge rate control circuit.

Prior art edge-rate control circuits generally fall into one of two categories: variable capacitance circuits and variable drive strength circuits. FIG. 1A illustrates a prior art edge-rate control circuit 20 of the variable capacitance type. The output of an inverter 21 is loaded by a capacitive element 22, the capacitance of which is controlled by the output of an inverter 24. When the enable input to the inverter 24 is in a first state, a relatively large capacitance is formed by the capacitive element 22, resulting in significant charge diversion to the capacitive element 22 and reducing the edge rate of the output signal on line 23. Conversely, when the enable input is in a second state, a relatively small capacitance is formed by the capacitive element 22, increasing the edge rate of the signal output by the inverter 21.

Figure 1B:
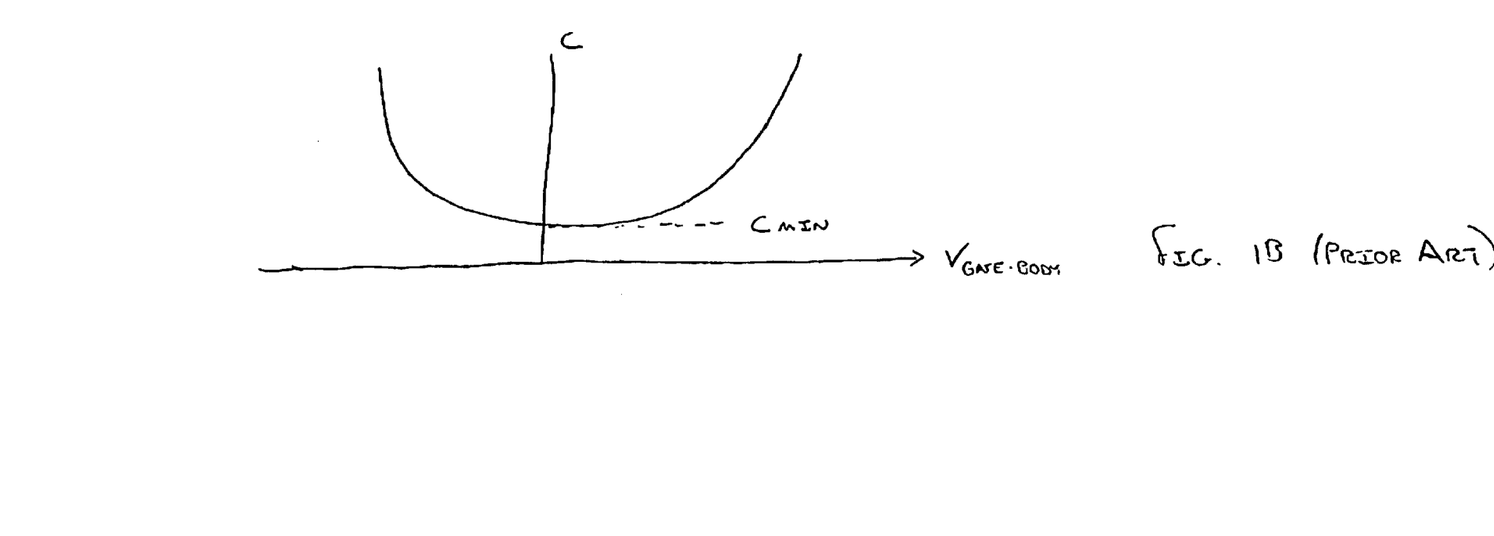
FIG. 1B illustrates capacitive characteristics of a MOS transistor.

Capacitive element 22 is typically formed by: a metal oxide semiconductor (MOS) transistor with the gate terminal 22A coupled to the output of the inverter 21 and the body terminal 22B coupled to the output of the inverter 24. The capacitance formed between the gate and body is a function of the potential across the gate and body terminals as shown in FIG. 1B. Thus, when the potential between the gate and body terminals is high, a relatively high capacitance is formed. Conversely, when the potential between the gate and body is low, a relatively low capacitance is formed. One disadvantage of the edge-rate control circuit 20 is that the MOS transistor 22 typically adds some minimum amount of capacitance ($C_{MIN}$ in FIG. 1B) even when the potential between the gate and body terminals is low. Thus, even the fast mode of the edge-rate control circuit 20 is slower than the edge rate that could be achieved if the MOS transistor 22 was omitted.

Figure 1C:
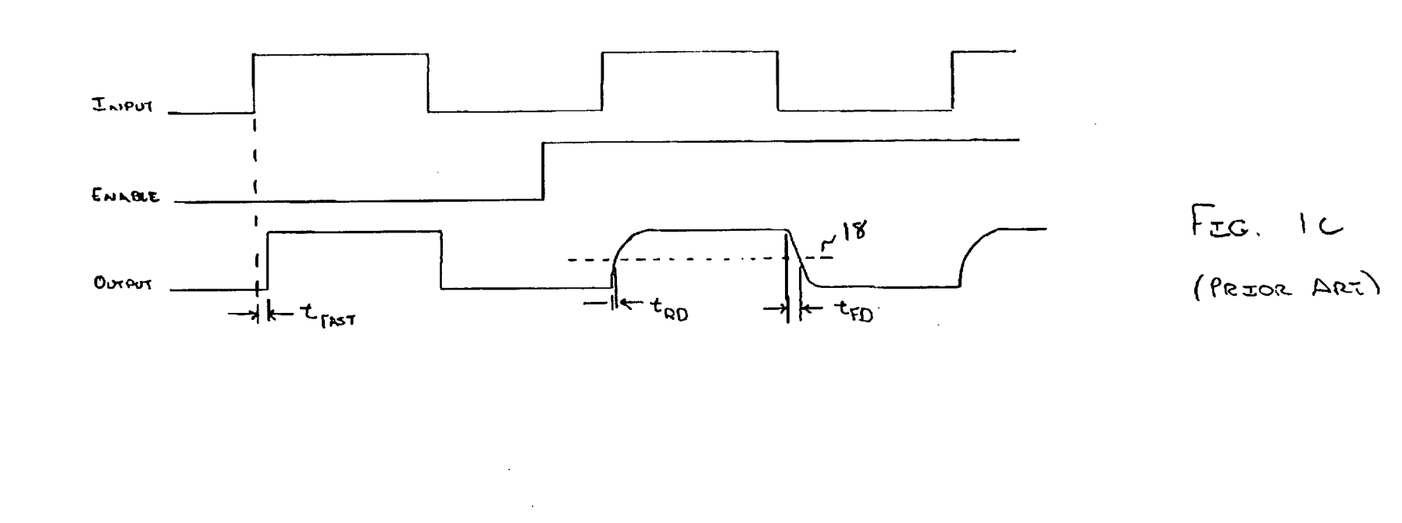
FIG. 1C is a set of timing diagrams demonstrating the operation of the prior art edge rate control circuit of FIG. 1A.

FIG. 1C illustrates another disadvantage of the edge-rate control circuit 20: asymmetric delay of rising and falling edges relative to a midpoint voltage 18. The input, output and enable signals shown in FIG. 1C refer to the input, output and enable signals for the circuit 20 of FIG. 1A. As shown, the output lags the input by a time $t_{FAST}$ while the enable signal is deasserted. Time $t_{FAST}$ is a combination of the propagation delay through the inverter 21 and the delay caused by the relatively small capacitance on capacitor 22 ($C_{MIN}$).

When the enable signal is asserted, the body potential of MOS transistor 22 becomes low so that, as the output signal rises, the capacitance of the MOS transistor 22 is increased. Thus, the rise time of the output signal slows as the capacitance increases. This is reflected in the waveform of FIG. 1C wherein the signal initially has a relatively short rise time from the low potential to the midpoint potential 18 and a longer rise time from the midpoint potential 18 to the high potential.

The fall time of the output signal starts out relatively slowly due to the increased capacitance of the MOS transistor, resulting in a relatively long fall time, $t_{FD}$, from the high potential to the midpoint potential 18. Because transition of the output signal is detected when or shortly after the signal crosses the midpoint potential, the time required for the output signal to transition to the midpoint potential is representative of the output signal delay time for many applications. Thus, the increased capacitance in the MOS transistor when the output signal is high results in asymmetric delays in the rising and falling edges of the output signal, as indicated by the difference between $t_{RD}$ and $t_{FD}$ in FIG. 1C.

Figure 2:
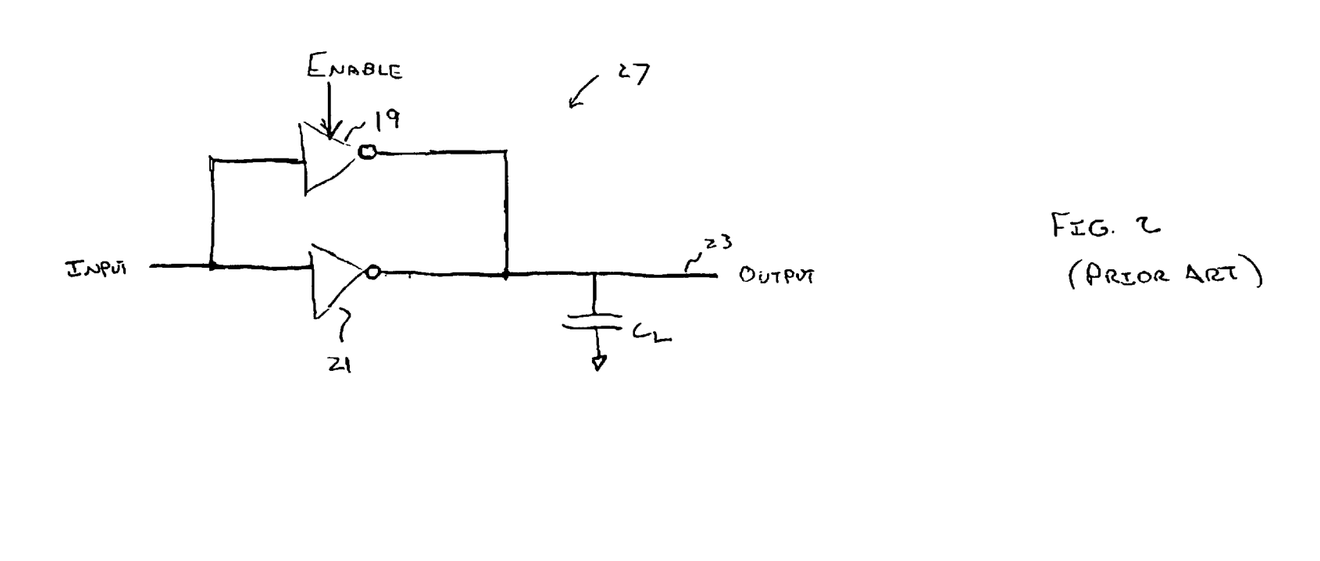
FIG. 2 illustrates an embodiment of an edge rate control circuit in accordance with the prior art.

FIG. 2 illustrates a prior art edge-rate control circuit 27 of the variable drive strength type. A tri-state inverter 19 coupled in parallel with inverter 21 is either tri-stated or enabled according to the state of an enable signal. When the tri-state inverter 19 is enabled (fast mode), additional current is available to charge the lumped capacitance $C_L$, speeding the overall rise time of the output signal. When the tri-state inverter 19 is disabled (slow mode), reduced current is available to charge the lumped capacitance $C_L$, slowing the rise time of the output signal. One disadvantage of the circuit 27 is that the tri-state inverter 19 itself contributes to the lumped capacitance, $C_L$, so that, even in fast mode, the circuit 27 still provides a slower edge rate than could be obtained if the tri-state inverter 19 is omitted.

In view of the foregoing, there is a need in the art for an improved technique for controlling edge rates of digital signals.

SUMMARY OF THE INVENTION

The apparatus of the invention is a circuit to control the edge rate of a digital signal. The circuit includes a conductor to carry a digital signal. A first capacitive component has a first node and a second node, with the second node being coupled to the conductor. A first phase control circuit has a first input node coupled to the conductor, a second input node to receive a first enable signal and an output node coupled to the first node of the first capacitive component. The first phase control circuit processes the digital signal from the conductor and the first enable signal to produce a control signal at the output node to control the edge rate of the digital signal. The first phase control circuit produces the control signal in one of at least two different phase relationships with the digital signal according to a state of the first enable signal. The control signal may be in phase with the digital signal or complementary to the digital signal.

The method of the invention operates to selectively control the edge rate of a digital signal. The method includes the step of combining a digital input signal with an enable signal to produce an edge rate control signal. A capacitive component is operated in response to the edge rate control signal such that the capacitive component selectively controls the edge rate of the digital input signal.

The technique of the invention facilitates the implementation of a spectrum of edge rate transition values. In addition to the spectrum of edge rate transition values, the invention provides a smaller minimal edge rate transition and a substantially larger maximum edge rate transition compared to prior art devices.

BRIEF DESCRIPTION OF THE DRAWINGS

For a better understanding of the invention, reference should be made to the following detailed description taken in conjunctions with the accompanying drawings, in which.

Like reference numerals refer to corresponding parts throughout the drawings.

DETAILED DESCRIPTION OF THE INVENTION

Figure 3A:
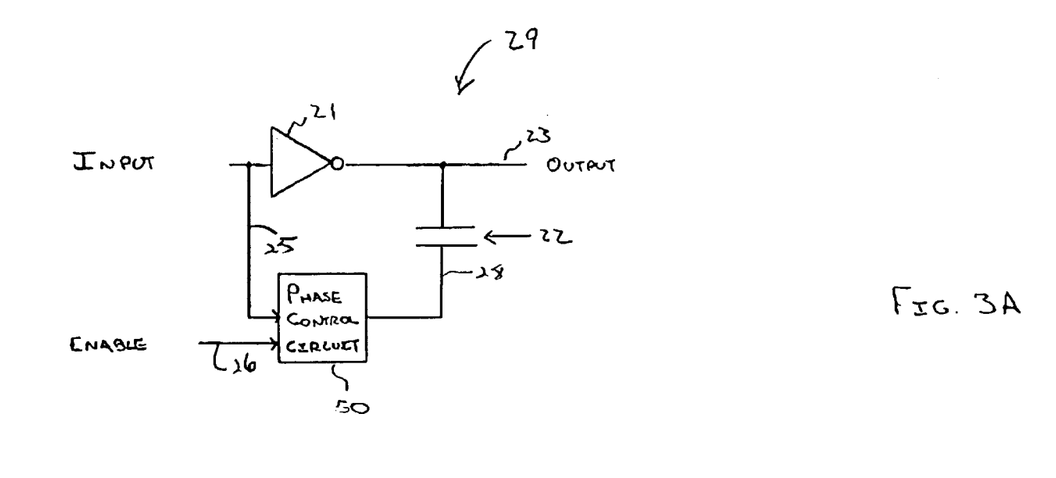
FIG. 3A illustrates an edge rate control circuit in accordance with an embodiment of the invention.

FIG. 3A illustrates an edge rate control circuit 29 according to an embodiment of the present invention. The edge rate control circuit 29 includes an inverting buffer 21 and capacitive element 22 connected in the same manner as the circuit of FIG. 1A. However, instead of applying a steady-state signal to the body of the capacitive element 22, a phase control circuit 56 is used to generate a control signal on node 28 having a predetermined phase relationship with the output signal on node 23. The phase control circuit 50 receives a digital input signal on node 25 and an enable signal on node 26.

When the enable signal is in a first state, the phase control circuit 50 outputs a control signal that is in phase with the output signal. When the enable signal is in a second state, the phase control circuit 50 generates a control signal that is 180° out of phase with (i.e., complementary to) the output signal. As discussed below, by controlling the phase of the control signal applied to the body of the capacitive element 22, the differential voltage across the terminals of the capacitive element 22, and ultimately the edge rate of the output signal, is controlled. In view of this differential voltage control of the capacitive element, the edge rate control circuit 29 is sometimes referred to as a differential control circuit. A number of different circuits for generating the control signal based on the signal input to inverter 21 and the enable signal are discussed below.

Figure 3B:
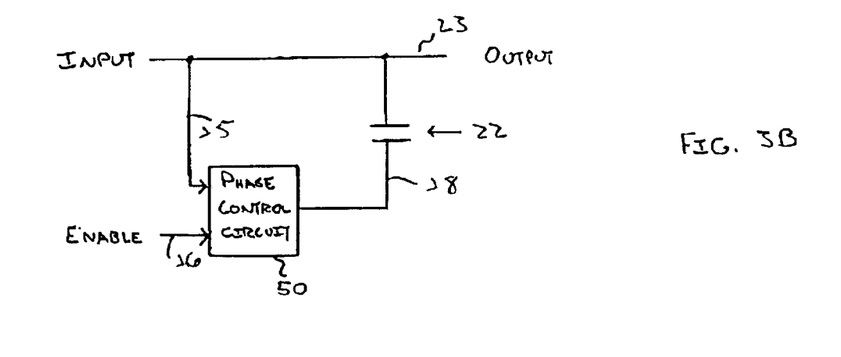
FIG. 3B illustrate an edge rate control circuit in accordance with an alternate embodiment of the invention.

FIG. 3B illustrates a differential control circuit according to an embodiment of the invention that does not include an inverter 21. The operation of the circuit of FIG. 3B is discussed below.

Figure 4A:
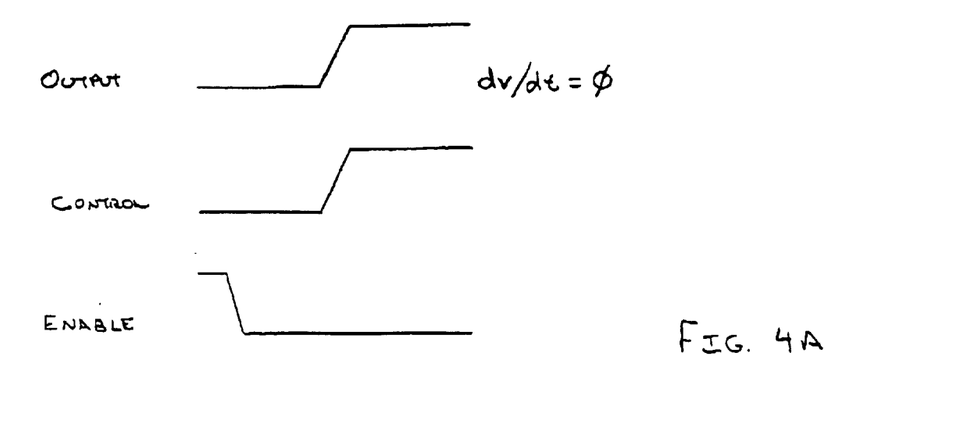
FIGS. 4A–4C illustrate timing diagrams in connection with the circuit of FIG. 3A.
Figure 4B:
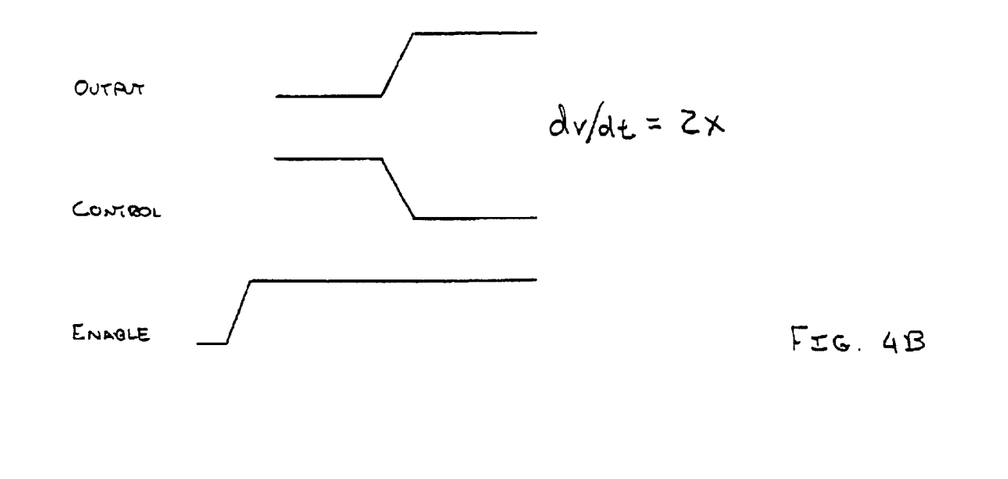

FIGS. 4A–4B illustrate the relationship between an output signal and the control signal of circuit 29 for different states of an: enable signal. In FIG. 4A, the enable signal is de-asserted, causing the phase control circuit 50 to generate a control signal in phase with the output signal. Because the control and output signals are in phase, the rate of change of the voltage (dv/dt) across the capacitive element 22 remains at or near zero. Because the current flowing into the capacitive element 22 is a function of the rate of change of the voltage across the capacitive element 22 (i.e., i=C*dv/dt), no current is diverted to charge the capacitive element 22 so that capacitive element 22 produces no signal delay.

Figure 4C:
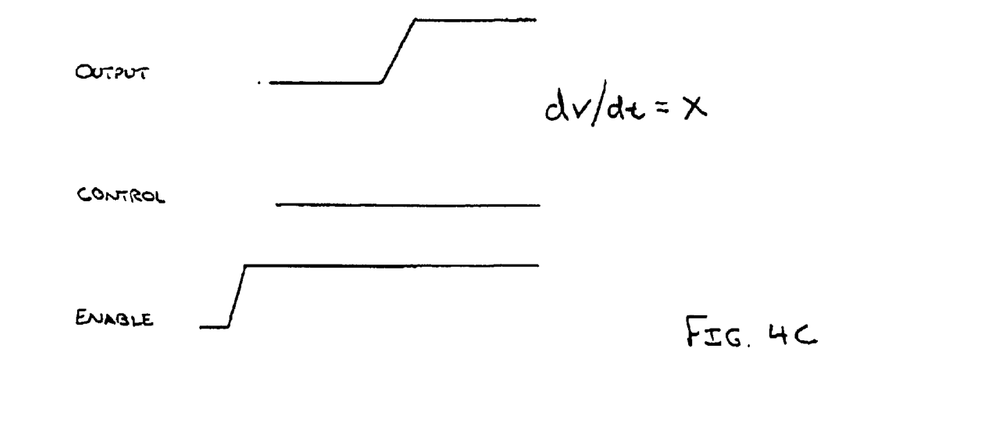

In FIG. 4B, the enable signal is asserted, causing the phase control circuit 50 to generate a control signal that is 180° out of phase with the output signal. Because the control and output signals are out of phase, the rate of change of voltage across the capacitive element at signal transition times is twice that obtained in the prior art circuit of FIG. 1A. That is, if the rate of change of the output signal with respect to a steady-state control signal is X (shown in FIG. 4C), then the rate of change of the output signal in FIG. 4B is 2X. Consequently, when the enable signal is asserted, the current flowing into the capacitive element 22 in the circuit of FIG. 3A is approximately twice that of the prior art circuit of FIG. 1A. Because a higher charging/discharging current flows in the capacitive element 22 of FIG. 3A, a substantially longer delay is achieved than with the prior art circuit of FIG. 1A. Still referring to FIG. 3A, it should be noted that buffer 21 need not need be an inverting buffer, but rather may be any circuit for driving the output 23.

As shown in FIG. 3B, buffer 21 may be omitted altogether in an alternative embodiment. In the circuit of FIG. 3B, the length of the trace between the input and output 23 may be designed to match the propagation delay through the phase control circuit 50 so that, when the enable signal is deasserted, the voltage across the terminals of the capacitive element 22 is maintained at or near zero.

Figure 5:
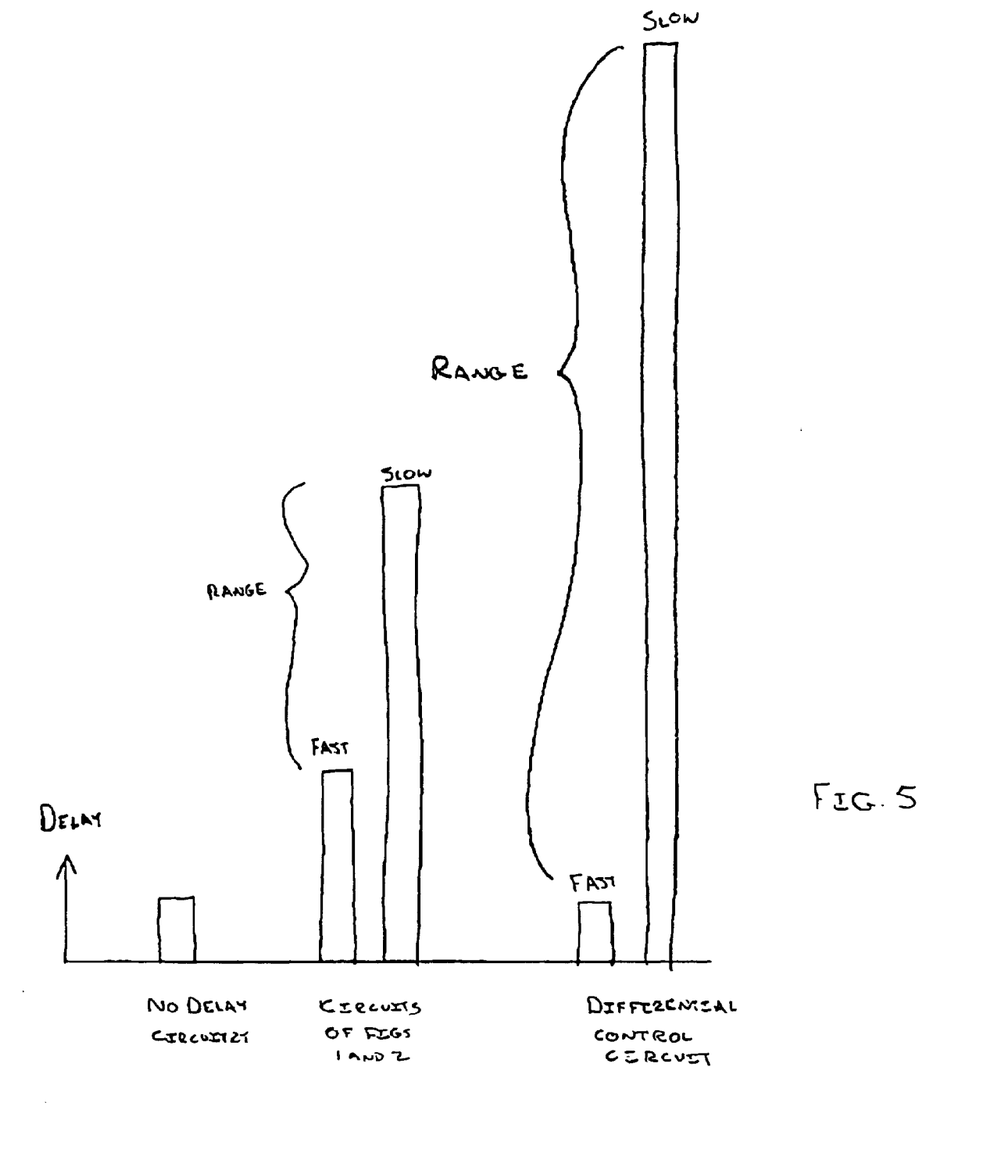
FIG. 5 illustrates bar charts comparing fast and slow mode edge rates for the circuits of FIGS. 3A, 2, and 1A.

FIG. 5 is a bar chart comparing the fast and slow mode edge rates of the differential control circuit 29 to the prior art circuits described above. As shown, the fast mode edge of the differential control circuit is approximately the same edge rate that would occur if there was no edge rate circuitry whatever (i.e., no capacitive element 22). By contrast, each of the prior art circuits described above has a slower fast mode due to the presence of incremental capacitance that diverts some level of current, even when the enable signal is de-asserted: Moreover, the circuits of FIGS. 1 and 2 do not slow the edge rate of the output signal in the slow mode as much as the differential control circuit. As discussed above, the differential control circuit produces a rate of change of voltage across the capacitive element 22 that is nearly twice the rate of change produced in the prior art circuits of FIGS. 1 and 2. Thus, by controlling the differential voltage across the capacitive element 22 rather than the capacitance of the capacitive element 22 or the drive strength of the circuitry used to supply current to the capacitive element 22, an edge rate control circuit having a faster fast mode, slower slow mode and greater overall range than the prior art circuits described above may be achieved.

Another advantage of the differential control circuit 29 is that rising/falling edge asymmetry that plagues prior art techniques is significantly reduced. More specifically, in slow mode the control signal is complementary to the output signal so that a capacitance substantially greater than Cmin (see FIG. 1B) is formed by the capacitive element, regardless of whether the output signal is high or low. This is in contrast to the prior art technique described above in which a steady-state control signal results in a relatively high capacitance when the output signal is high and a relatively low capacitance ($C_{MIN}$) when the output signal is low.

Another advantage of the differential control circuit 29 is that the choice of capacitive elements is not limited to capacitive elements having the characteristic curve shown in FIG. 1B. That is, because edge rate control is effected by controlling the differential voltage across the terminals of capacitive element 22 rather than by adjusting the capacitance of the capacitive element 22, virtually any type of capacitor can be used to form capacitive element 22 in various embodiments of the present invention (e.g., metal plate capacitors, depletion-type MOS transistors, enhancement type MOS transistors, etc.).

Figure 6:
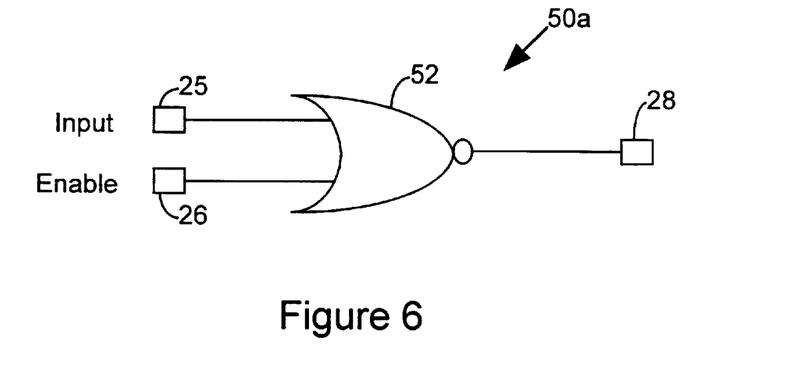
FIG. 6 illustrates an implementation of a phase control circuit of an edge rate control circuit of the invention.

FIG. 6 illustrates one embodiment of the phase control circuit 50a, in which the edge rate control signal is produced at node 28 by a NOR gate 52 receives both an enable signal from node 26 and the digital input signal from node 25.

If the enable signal is a logic-low (the fast mode), the control signal will be an inverted version of the digital input signal. Thus, both the gate 22a and the body 22b of the PMOS transistor 22 will be driven by effectively the same signal, so that there will be essentially a constant differential voltage across the PMOS transistor 22 and no drive current will be absorbed. Preferably, logic gate 52 is designed such that the delay required for the input signal 25 to pass through logic gate 52 is the same as the delay required for the input signal 25 to pass through driver 21. The delay in the fast mode will therefore be substantially independent of the capacitance of the PMOS transistor 22.

If the enable signal is a logic-high (the slow mode), the control signal at node 28 will out of phase with the signal at node 23, slowing the output signal edge rate as described above.

Observe that in the fast mode of operation, both the gate 22a and the body 22b are driven by the same signal, controlled by the signal on the input node 25 (the gate 22a and the body 22b process the inverted input signal). Thus, in the circuit of FIG. 3A, delay is controlled by the phase relationship between the signal applied to the transistor body and the output signal. This is in contrast to the prior art variable-capacitance circuit in which the level of the signal applied to the transistor body, not its phase relationship with the output signal, controls the edge rate transition. Advantageously, this phase-coordinated operation of the invention allows edge rate control, regardless of the type of capacitor used to implement the capacitive element 22. This feature of the invention also reduces duty cycle distortion, a problem associated with prior art delay circuits.

Figure 7:
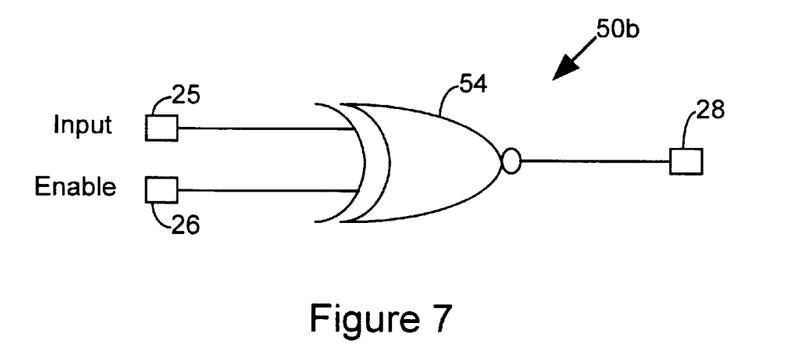
FIG. 7 illustrates an alternate implementation of a phase control circuit of an edge rate control circuit of the invention.

FIG. 7 illustrates an alternative embodiment of the phase control circuit 50b. The edge rate control signal is output by an exclusive NOR (XNOR) gate 54, which receives both an enable signal from node 26 and the digital input signal from node 25.

If the enable signal is a logic-low (the fast mode), the control signal will be in phase with the digital output signal at node 23. Thus, both the gate 22a and the body 22b of PMOS transistor 22 will be driven by effectively the same signal, so that there will be essentially a constant differential voltage across the PMOS transistor 22 and no drive current will be absorbed. The edge rate in the fast mode will therefore be substantially independent of the capacitance of the PMOS transistor 22.

If the enable signal is a logic-high (the slow, mode), the control signal will be 180° out of phase (i.e., complementary to) the output signal at node 23. Thus, the rate of change of the voltage across the capacitive element 22 is increased, slowing the output signal edge rate.

Thus, with the embodiments of FIGS. 3a and 3b, the differential control circuit operates in either an in-phase mode for a fast edge rate or an out-of-phase mode for a slow edge rate. In both cases, the asymmetry between rising and falling edge delay is reduced compared to the prior art variable capacitance circuit described above.

Figure 8:
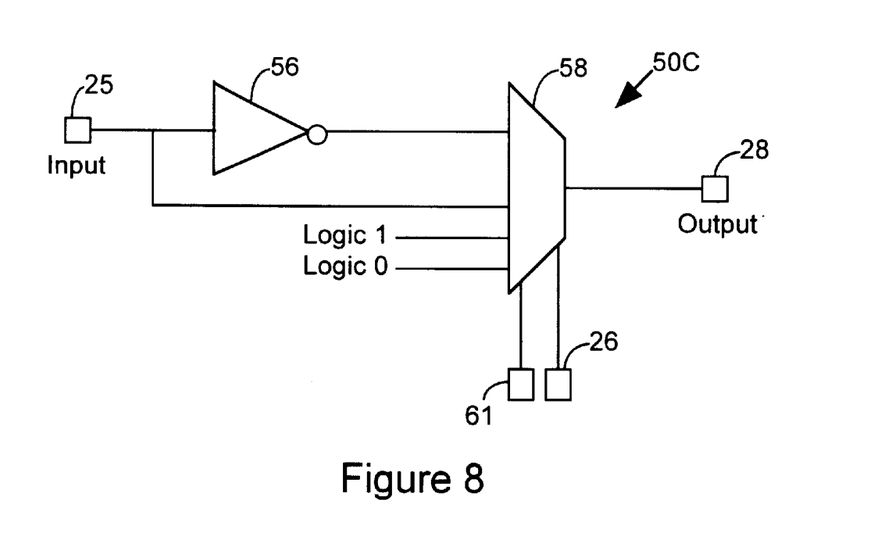
FIG. 8 illustrates an alternate implementation of a phase control circuit of an edge rate control circuit of the invention.

FIG. 8 illustrates an alternative embodiment of the phase control circuit 50c. The edge rate control signal at node 28 is output by a multiplexor 58. The multiplexor 58 is driven by the digital input signal from node 25 and the output of an inverter 56. The inverter 56 receives the digital input signal from node 25, so that the multiplexor 58 receives both the digital input signal and an inverted version of the digital input signal. Additional input nodes to the multiplexor may be assigned logic high and logic low values. Enable signals are applied to select inputs 61 and 26 of the multiplexor 58.

If the enable signals are both at a logic-low level (the fast mode), the multiplexor will output the inverted version of the digital input signal. Thus, both the gate 22a and the body 22b of the PMOS transistor 22 will be driven by effectively the same signal, so that there will be essentially a constant differential voltage across the PMOS transistor 22 and no drive current will be absorbed. The edge rate in the fast mode will therefore be substantially independent of the capacitance of the PMOS transistor 22. If one enable signal has a logic low value and the second enable signal has a logic high value (the slow mode), the multiplex or will provide a signal equal to the digital input signal as an output. Because the signal applied to the gate 22a of the PMOS transistor 22 is an inverted version of the digital input signal, the control signal applied to the body 22b of the PMOS transistor 22 will be out of phase with the signal applied to the gate 22a, resulting in charge absorption in the PMOS transistor 22 and increasing delay through the circuit 29.

If one of steady state inputs to the multiplexor is selected, the control signal will be a constant logic level, resulting in an intermediate edge rate. Note that, if a steady-state control input is selected, edge rates of the falling and rising edges of the output signal will be asymmetric. For example, if the Logic 1 control is selected, the rising edge will be slowed more than the falling, edge (relative to a mid-point potential). Conversely, if the Logic 0 control is selected, the falling edge is slowed more than the rising edge. By providing for selectable control signals in this manner, dynamic control over the relative rising and falling edge rates is achieved. This can be particularly useful in duty cycle control applications.

Figure 9:
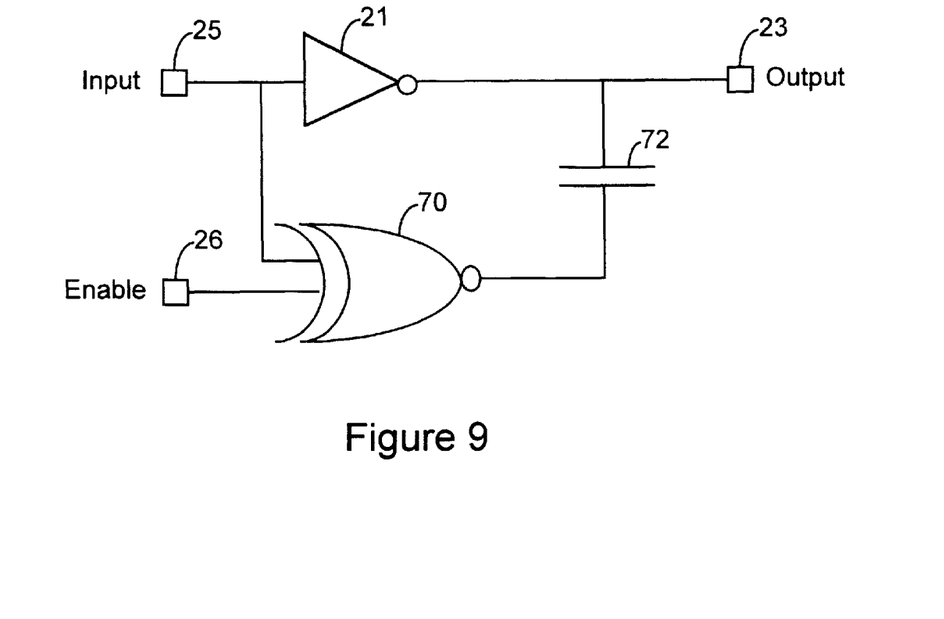
FIG. 9 illustrates an alternate embodiment of the edge rate control circuit of the invention.

FIG. 9 illustrates an alternative embodiment of the present invention, using an exclusive NOR 70 as the phase control circuit, and using a parallel plate capacitor 72 as the capacitive component. As in FIG. 7, the capacitive component will receive in phase signals to form an essentially constant differential voltage in the fast mode, and out of phase signals on each plate in the slow mode.

With the parallel plate capacitor 72, the rising and falling edges are affected equally. Thus, the output signal does not experience duty cycle distortion.

Observe that in the embodiment of FIG. 9, a steady state control signal is not applied to capacitive element 22. Instead, the capacitive element 72 always experiences in phase or out of phase signals. Since the capacitive element is only exposed to phase signals of this type, a large capacitive element can be used, since the fast mode operation where the signals are in phase will still produce a fast edge rate. For out of phase operation, rate of change of the differential voltage results in approximately twice as much delay as prior art circuits using a comparably sized load capacitance.

As previously indicated, the circuit of the invention provides a spectrum of edge rates depending upon whether an in phase, constant, or out of phase edge rate control signal is used. Edge rate resolution can be further enhanced by forming embodiments of the invention in which multiple enable signals are used to control phase control signals. Exemplary embodiments of such circuits are shown in FIGS. 10–12.

Figure 10:
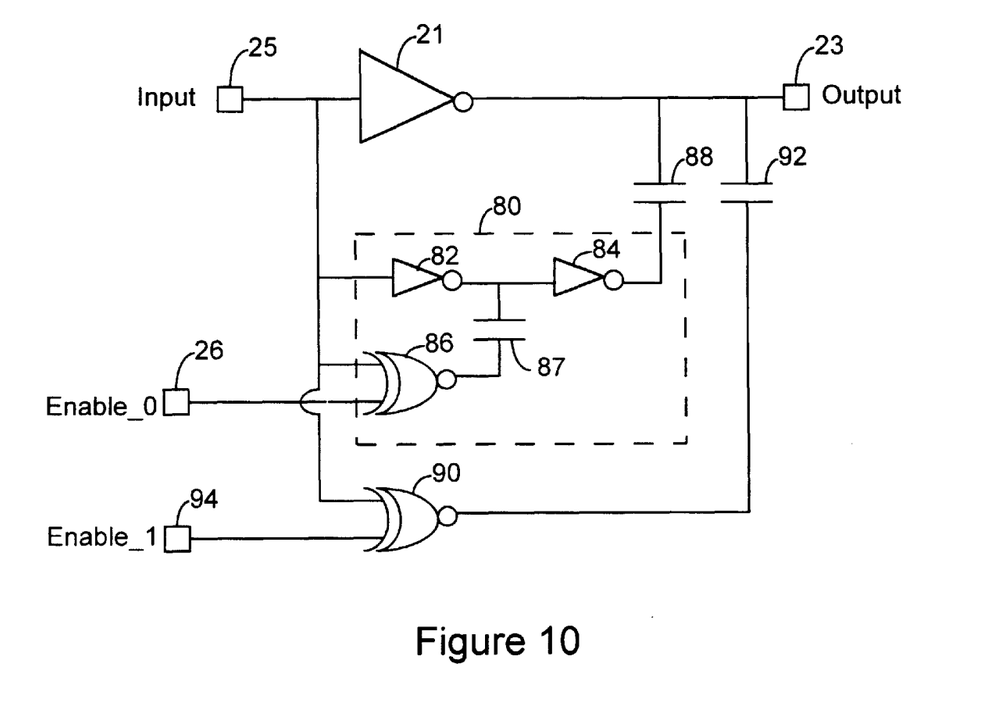
FIG. 10 illustrates a recursive or nested configuration of the edge rate control circuit of the invention that provides enhanced edge rate control.

The circuit of FIG. 10 includes both phase control circuit 90 and nested phase control circuit 80. The edge rate at the output node can be controlled with an enable_1 signal applied to node 94, to produce the operation described in connection with FIG. 9.

Edge rate can be further controlled by the nested edge rate control circuit 80. The additional circuit 80 includes an inverter 82, an XNOR gate 86, and a capacitive element 87, thus replicating the components of FIG. 9. The edge rate control signal produced by these components is applied to an inverter 84 and an additional capacitive element 88, to control the edge rate of the signal on the output node 23.

Figure 11:
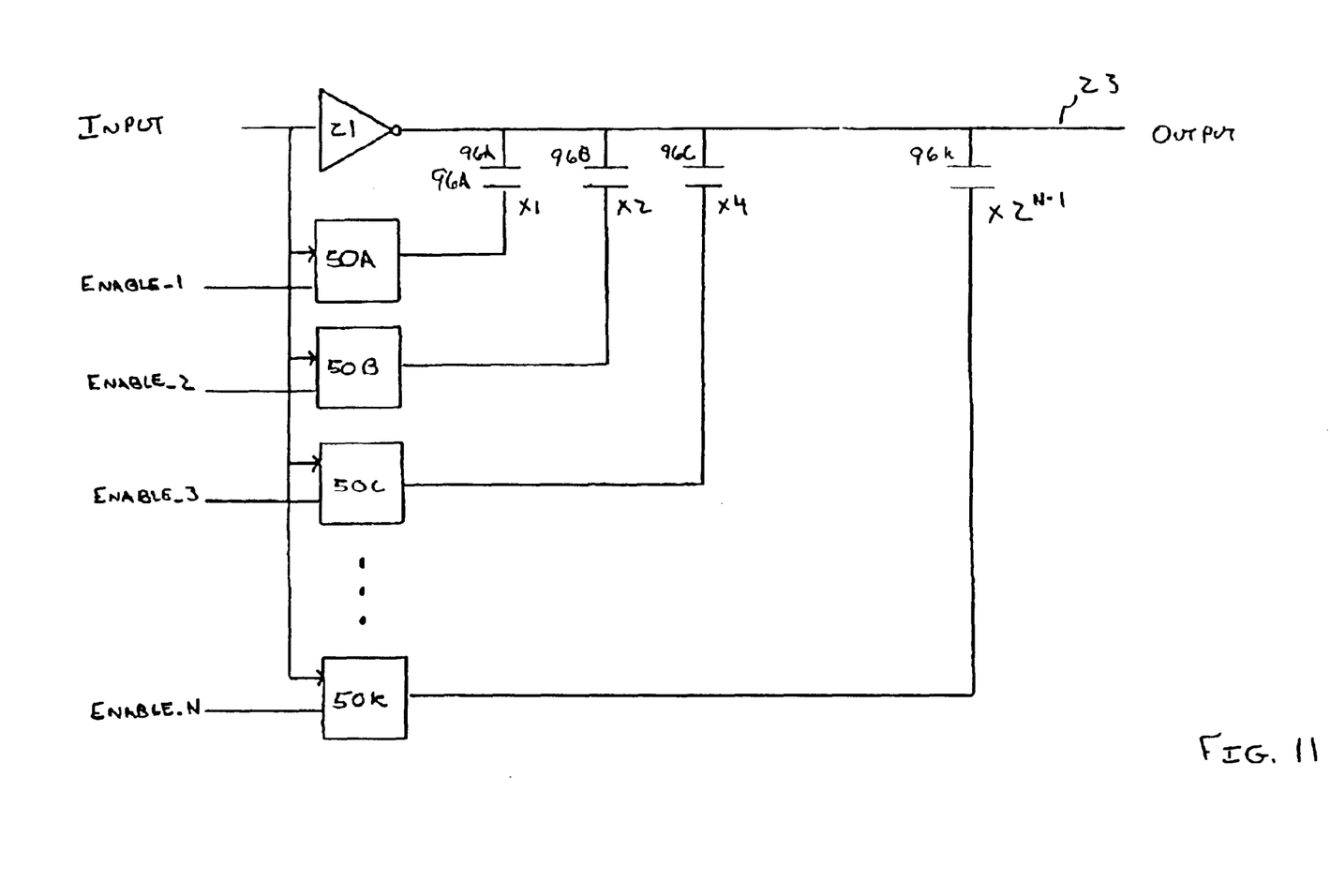
FIG. 11 illustrates an alternate embodimnent of the invention that facilitates the formation of $2^N$ different edge rates.
Figure 12:
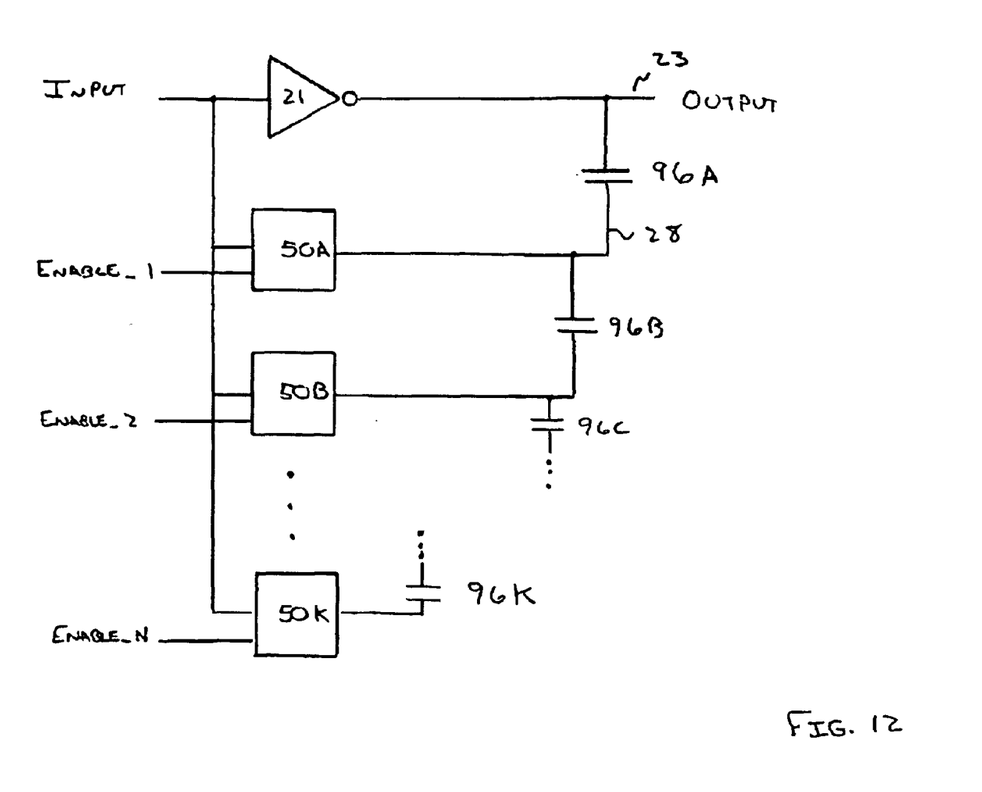
FIG. 12 illustrates another embodiment of the invention that facilitates the formation of $2^N$ different edge rates.

FIG. 11 illustrates an alternate embodiment of the invention that can be used to provide $2^N$ different edge rates. As shown, the capacitive element and phase control circuit have been duplicated K times, with each capacitive element (96A–96K) being sized in a binary weighted fashion (i.e., the capacitance of 96B is approximately twice that of 96A, the capacitance of 96C is approximately twice that of 96B, etc.). Enable inputs 1–N are used to control phase control circuits 50A–50K, respectively. Thus, based on the value of the control word formed by enable inputs 1–N, any one of $2^N$ different edge rates may be provided at output 23.

FIG. 12 illustrates another embodiment of the present invention that can be used to provide $2^N$ different edge rates. In this embodiment, each of the capacitive elements 96B–96K is coupled to the output of the phase control circuit for a preceding capacitive element, thus providing for high resolution control of the signal 28. By varying the setting of enable inputs 1–N, 2N different edge rates can be achieved in relatively high resolution increments.

Figure 13:
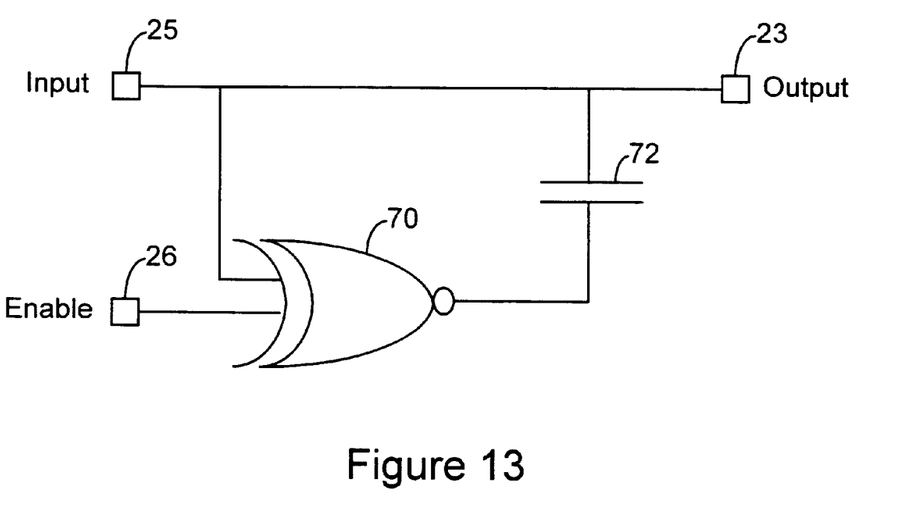
FIG. 13 illustrates a simplified alternate embodiment of the edge rate control circuit of the invention.

Other variations of the invention will be appreciable to those skilled in the art. For example, FIG. 13 illustrates an embodiment of the invention corresponding to the circuit of FIG. 9 wherein the inverter 21 is eliminated. As long as the XNOR gate 70 is fast enough, the inverter 21 may be eliminated.

The invention has been implemented with a PMOS transistor operating as a capacitive component. The gate of the PMOS transistor is connected to load the logic gate, and the source and drain, tied together, receive the control signal. Typical simulation results, using a PMOS transistor, show a delay of 160 ps in slow mode, and 32 ps in fast mode. Therefore, the adjustable range of the delay is 128 ps, while the minimum delay is only 32 ps. Compared to the prior art, the invention has both a greater delay range and a smaller minimum delay.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown at the logic gate level in order to avoid unnecessary distraction from the underlying invention. Thus, the foregoing descriptions of specific embodiments of the present invention are presented for purposes of illustration and description. They. are not intended to be exhaustive or to limit the invention to the precise forms disclosed, as obviously many modifications and variations are possible in view of the above teachings. The embodiments were chosen and described in order to best explain the principles of the invention and its practical applications, the thereby enable others skilled in the art to best utilize the invention and various embodiments with various modifications as are suited to the particular use contemplated. It is intended that the scope of the invention be defined by the following claims and their equivalents.

what is claimed:

1. A circuit to control the edge rate of a digital: signal, the circuit comprising:

a conductor to carry a digital signal;

a first capacitive component having a first node and a second node, said second node being coupled to said conductor; and a first phase control circuit having a first input node coupled to said conductor, a second input node to receive a first enable signal and an output node coupled to said first node of said first capacitive component, said first phase control circuit processing said digital signal from said conductor and said first enable signal to produce a control signal at said output node to control the edge rate of said digital signal.

2. The circuit of claim 1 wherein said first phase control circuit produces said control signal in one of at least two different phase relationships with said digital signal according to a state of said first enable signal.

3. The circuit of claim 2 wherein said control signal is substantially in phase with said digital signal in one of said at least two different phase relationships.

4. The circuit of claim 2 wherein said control signal is substantially complementary to said digital signal in one of said at least two different phase relationships.

5. The circuit of claim 1 wherein said control signal controls the rate of change of voltage across said capacitive component to control the edge rate of said digital signal.

6. The circuit of claim 1 wherein said first phase control circuit includes a multiplexer to receive said digital signal, an inverted version of said digital signal and at least one steady-state voltage signal, a selection node of said multiplexer being responsive to said first enable signal to selectively output said digital signal, said inverted version of said digital signal, and said at least one steady-state voltage.

7. The circuit of claim 1 further comprising a nested edge rate control circuit to control the edge rate of said control signal output by said first phase control circuit, said nested edge rate control circuit including:

a second capacitive component having a first node and a second node, said second node of said second capacitive component being coupled to said output node of said first phase control circuit; and a second phase control circuit having a first input node coupled to said conductor, a second input node to receive a second enable signal and an output node coupled to said first node of said second capacitive component, said second phase control circuit processing said digital signal from said conductor and said second enable signal to produce a second control signal at said output node of said second phase control circuit to control the edge rate of said control signal output by said first phase control circuit.

8. The circuit of claim 1 further comprising:

a second capacitive component having a first node and a second node, said second node being coupled to said conductor; and a second phase control circuit having a first input node coupled to said conductor, a second input node to receive a second enable signal and an output node coupled to said first node of said second capacitive component, said second phase control circuit processing said digital signal from said conductor and said second enable signal to produce a control signal at said output node of said second phase control circuit to control the edge rate of said digital; signal.

9. The circuit of claim 8 wherein said second capacitive component has a smaller capacitance than said first capacitive component.

10. A circuit to control the edge rate of a digital signal, the circuit comprising:

a buffer circuit with a buffer input node to receive a digital signal and a buffer output node, said buffer circuit processing said digital signal to produce a buffered signal on said buffer output node;

a first capacitive component having a first node and a second node, said second node being coupled to said buffer output node; and a first phase control circuit having a first input node coupled to said buffer input node, a second input node to receive a first enable signal and an output node coupled to said first node of said first capacitive component, said first phase control circuit processing said digital signal from said conductor and said first enable signal to produce a control signal at said output node to control the edge rate of said digital signal.

11. The circuit of claim 10 wherein said first phase control circuit produces said control signal in one of at least two different phase relationships with said digital signal according to a state of said first enable signal.

12. The circuit of claim 11 wherein said control signal is substantially in phase with said digital signal in one of said at least two different phase relationships.

13. The circuit of claim 11 wherein said control signal is substantially complementary to said digital signal in one of said at least two different phase relationships.

14. The circuit of claim 10 wherein said control signal controls the rate of change of voltage across said capacitive component to control the edge rate of said digital signal.

15. The circuit of claim 10 wherein said first phase control circuit includes a multiplexer to receive said digital signal, an inverted version of said digital signal and at least one steady-state voltage, a signal selection node of said multiplexer being responsive to said first enable signal to selectively output said digital signal, said inverted version of said digital signal and said at least one steady-state voltage.

16. The circuit of claim 10 wherein said buffer circuit is an inverter.

17. The circuit claim 10 wherein said capacitive component is implemented as a parallel plate capacitor.

18. The circuit of claim 10 wherein said capacitive component is implemented as a semiconductor device.

19. A method of controlling a digital signal transition, said method comprising the steps of:

combining a digital input signal with an enable signal to produce an edge rate control signal; and operating a capacitive component in response to said edge rate control signal, such that said capacitive component selectively controls the edge rate of said digital input signal.

20. The method of claim 19 wherein said combining step includes the step of combining said digital input signal and said enable signal to produce an edge rate control signal that is complementary to said digital input signal.

21. The method of claim 19 wherein said combining step includes the step of combining said digital input signal and said enable signal to produce an edge rate control signal that is in-phase with said digital input signal.

* * * * *

UNITED STATES PATENT AND TRADEMARK OFFICE
CERTIFICATE OF CORRECTION

PATENT NO. : 6,657,468 B1
DATED : December 2, 2003
INVENTOR(S) : Best et al.

It is certified that error appears in the above-identified patent and that said Letters Patent is hereby corrected as shown below:

Column 8,
Line 25, between "digital" and "signal" delete ":".

Column 9,
Line 23, between "digital" and "signal" delete ";".

Signed and Sealed this

Twenty-seventh Day of December, 2005

JON W. DUDAS
*Director of the United States Patent and Trademark Office*